United States Patent
Choi et al.

(10) Patent No.: US 11,171,289 B2
(45) Date of Patent: Nov. 9, 2021

(54) METHOD FOR MANUFACTURING ORGANIC SOLAR CELL AND ORGANIC SOLAR CELL MANUFACTURED USING SAME

(71) Applicant: LG CHEM, LTD., Seoul (KR)

(72) Inventors: Doowhan Choi, Daejeon (KR); Jiyoung Lee, Daejeon (KR); Songrim Jang, Daejeon (KR); Younshin Kim, Daejeon (KR)

(73) Assignee: LG CHEM, LTD.

( * ) Notice: Subject to any disclaimer, the term of this patent is extended or adjusted under 35 U.S.C. 154(b) by 0 days.

(21) Appl. No.: 16/605,910

(22) PCT Filed: Apr. 27, 2018

(86) PCT No.: PCT/KR2018/004938
§ 371 (c)(1),
(2) Date: Oct. 17, 2019

(87) PCT Pub. No.: WO2018/203625
PCT Pub. Date: Nov. 8, 2018

(65) Prior Publication Data
US 2020/0135946 A1  Apr. 30, 2020

(30) Foreign Application Priority Data

May 2, 2017 (KR) .................. 10-2017-0056220
Oct. 26, 2017 (KR) .................. 10-2017-0140290

(51) Int. Cl.
*H01L 51/00* (2006.01)
*H01L 51/42* (2006.01)

(52) U.S. Cl.
CPC ...... *H01L 51/0026* (2013.01); *H01L 51/0029* (2013.01); *H01L 51/4246* (2013.01)

(58) Field of Classification Search
CPC ............ H01L 51/0026; H01L 51/0029; H01L 51/4246; Y02E 10/549
See application file for complete search history.

(56) References Cited

U.S. PATENT DOCUMENTS

| 9,412,959 B1 * | 8/2016 | Cha ..................... H01L 51/4253 |
| 2009/0023235 A1 * | 1/2009 | MacKenzie ......... H01L 51/0022 438/29 |

(Continued)

FOREIGN PATENT DOCUMENTS

| CN | 102509769 | 6/2012 |
| CN | 105914298 A * | 8/2016 |

(Continued)

OTHER PUBLICATIONS

KR20170038397A, Machine Translation, Kim (Year: 2017).*

(Continued)

*Primary Examiner* — Bitew A Dinke
(74) *Attorney, Agent, or Firm* — Myers Bigel, P.A.

(57) ABSTRACT

Provided is a disclosure relating to a method for manufacturing an organic solar cell comprising providing a substrate; forming a first electrode on the substrate; forming a photoactive layer by coating a solution comprising a photoactive material and a solvent on the first electrode; drying the photoactive layer in a closed drying system having a constant volume; and forming a second electrode on the photoactive layer, and an organic solar cell manufactured using the same.

18 Claims, 3 Drawing Sheets

(56) References Cited

U.S. PATENT DOCUMENTS

| | | | |
|---|---|---|---|
| 2009/0126796 A1 | 5/2009 | Yang et al. | |
| 2009/0266416 A1* | 10/2009 | Tolbert | B82Y 10/00 |
| | | | 136/256 |
| 2010/0127244 A1 | 5/2010 | Kronholm et al. | |
| 2011/0308598 A1 | 12/2011 | Girotto | |
| 2012/0138865 A1* | 6/2012 | Blouin | C08L 65/00 |
| | | | 252/500 |
| 2013/0069020 A1* | 3/2013 | May | H01L 51/0039 |
| | | | 252/519.21 |
| 2014/0338728 A1 | 11/2014 | Cheyns | |
| 2015/0179965 A1 | 6/2015 | Lee et al. | |
| 2015/0249214 A1* | 9/2015 | Watanabe | H01L 51/0036 |
| | | | 136/263 |
| 2015/0263285 A1* | 9/2015 | Zhou | H01L 51/4273 |
| | | | 136/256 |
| 2016/0056397 A1* | 2/2016 | Schumann | H01L 51/0036 |
| | | | 136/256 |
| 2016/0181552 A1* | 6/2016 | May | H01L 51/0094 |
| | | | 257/40 |
| 2016/0329499 A1* | 11/2016 | Bae | C07D 405/10 |
| 2017/0084399 A1* | 3/2017 | Vak | H01L 51/0036 |
| 2017/0338045 A1* | 11/2017 | Vak | H01L 27/302 |
| 2019/0378992 A1* | 12/2019 | Skulason | C07D 487/04 |

FOREIGN PATENT DOCUMENTS

| | | | | |
|---|---|---|---|---|
| JP | 2008536317 A | | 9/2008 | |
| JP | 2009542725 A | | 12/2009 | |
| JP | 2010205976 A | | 9/2010 | |
| JP | 2010205976 A | * | 9/2010 | |
| JP | 2012508972 A | | 4/2012 | |
| JP | 2015513209 A | | 4/2015 | |
| JP | 2016195147 A | * | 11/2016 | |
| JP | 2016195147 A | * | 11/2016 | |
| KR | 20110128509 | | 11/2011 | |
| KR | 101161582 | | 7/2012 | |
| KR | 20140049804 | | 4/2014 | |
| KR | 20160011909 | | 2/2016 | |
| KR | 20170001039 | | 1/2017 | |
| KR | 20170037175 | | 4/2017 | |
| KR | 20170037175 A | * | 4/2017 | |
| KR | 20170038397 | | 4/2017 | |
| KR | 20170038397 A | * | 4/2017 | |
| WO | WO-2009122958 A1 | * | 10/2009 | H01L 51/5092 |
| WO | 2013065621 A1 | | 5/2013 | |

OTHER PUBLICATIONS

European Search Report corresponding to EP 18794773.4, dated Feb. 20, 2020 (8 pages).

Tsai et al. "Efficiency Improvement of Organic Solar Cells by Slow Growth and Changing Spin-Coating Parameters for Active Layers" Japanese Journal of Applied Physics, 50: 022301-1 to 022301-4 (2011).

International Search Report corresponding to PCT/KR2018/004938, dated Aug. 9, 2018 (5 pages including English translation).

Dong, Wan Jae, et al., "Simple Bar-Coating Process for Fabrication of Flexible Top-Illuminated Polymer Solar Cells on Metallic Substrate", Adv. Mater. Technol. 2016, 1600128, 7 pages.

* cited by examiner

①: Closed system 600cm³/170μl
②: Closed system 150cm³/170μl

FIG. 3

Green (η: 6.5%)

FIG. 4

Blue (η: 0.14%)

FIG. 5

METHOD FOR MANUFACTURING ORGANIC SOLAR CELL AND ORGANIC SOLAR CELL MANUFACTURED USING SAME

CROSS REFERENCE TO RELATED APPLICATIONS

This application is a 35 U.S.C. § 371 national stage application of PCT International Application No. PCT/KR2018/004938, filed Apr. 27, 2018, which claims priority from Korean Patent Application Nos. 10-2017-0056220 and 10-2017-0140290, filed May 2, 2017 and Oct. 26, 2017, respectively, the contents of which are incorporated herein in their entireties by reference. The above-referenced PCT International Application was published in the Korean language as International Publication No. WO 2018/203625 on Nov. 8, 2018.

TECHNICAL FIELD

The present disclosure is a disclosure relating to a method for manufacturing an organic solar cell, and an organic solar cell manufactured using the same.

BACKGROUND ART

In a global solar cell market, approximately 90% is a solar cell based on a silicon material. Silicon solar cells are expensive in material costs and production unit costs, and therefore, are still limited in generating electricity on a large scale such as nuclear power generation and thermal power generation. Solar cell devices using organic materials have emerged as a solution to the problem of such silicon-based solar cells, and this is due to the fact that organic solar cells have an advantage of manufacturing the devices at lower costs.

An organic solar cell is largely formed with an anode, a photoactive layer and a cathode. Although organic materials are generally used as the photoactive layer, and indium thin oxide (ITO) and aluminum (Al) are mostly used as the anode and the cathode, respectively, studies on replacing anode and cathode electrode materials with organic materials are currently active globally. In addition, energy conversion efficiency has tended to increase with research outcomes on novel organic polymers having a low band-gap.

In a general organic solar cell having a structure formed with anode electrode/hole transfer layer/photoactive layer/electron transfer layer/cathode electrode, a method for forming the photoactive layer is largely divided into two methods of providing a thin film using a method of depositing electron donor and electron acceptor materials under the vacuum atmosphere, and providing a thin film using a solution process. In more detail, the method of using deposition uses monomers as both the electron donor and the electron acceptor, whereas the method of using a solution process generally uses polymers as the electron donor material, and uses polymers, fullerene derivatives, perylene derivatives, quantum dot inorganic nanoparticles and the like as the electron acceptor. Accordingly, compared to depositing and using monomers, using the solution process with polymers does not require vacuum technologies, and is capable of mass-producing large area devices at lower costs, and as a result, the weight of researches has recently been concentrated on the solution process using polymers.

The photoactive layer sometimes uses high boiling point solvents such as trichlorobenzene or high boiling point additives such as 1,8-diiodooctane in order to control thin film morphology, and, although these additives may be removed when thermal depositing an existing anode under high vacuum, there is a problem in that these may not be readily removed when progressing all processes after a substrate using a solution method. Accordingly, in an organic solar cell device manufactured using an existing solution method, moisture remaining due to an insufficient drying process after coating is identified as bubbles on the surface in a post heat treatment process. Such bubbles in the organic solar cell device cause a poor contact between interfaces of the photoactive layer and the cathode, and when bubbles are severely generated, the circuit of the device may be short-circuited, and ultimately, enhancement in the energy conversion efficiency of the device may not be expected.

When the drying temperature is further raised after the solution coating to remove residual moisture in view of the above, the solution coated surface may be roughened by a diffusion phenomenon, which furthermore causes another problem of the coating surface being thermally decomposed.

PRIOR ART DOCUMENTS

Patent Documents

Korean Patent Application Laid-Open Publication No. 2014-0049804

DISCLOSURE

Technical Problem

The present disclosure is directed to providing a method for manufacturing an organic solar cell having efficient phase separation between an electron donor and an electron acceptor.

The present disclosure is also directed to providing an organic solar cell having improved energy conversion efficiency obtained using the manufacturing method.

Technical Solution

One embodiment of the present specification provides a method for manufacturing an organic solar cell comprising providing a substrate; forming a first electrode on the substrate; forming a photoactive layer by coating a solution comprising a photoactive material and a solvent on the first electrode; drying the photoactive layer in a closed drying system having a constant volume; and forming a second electrode on the photoactive layer.

Another embodiment of the present specification provides organic solar cell manufactured using the method for manufacturing an organic solar cell.

Advantageous Effects

According a method for manufacturing an organic solar cell according to one embodiment of the present specification, proper phase separation between an electron donor and an electron acceptor can be induced by optimizing photoactive layer drying.

In addition, an organic solar cell manufactured using the method for manufacturing an organic solar cell according to an embodiment of the present specification is effective in obtaining excellent energy conversion efficiency.

MODE FOR DISCLOSURE

In the present specification, a description of one member being placed "on" another member comprises not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

Hereinafter, the present specification will be described in more detail.

The present specification provides a method for manufacturing an organic solar cell comprising providing a substrate; forming a first electrode on the substrate; forming a photoactive layer by coating a solution comprising a photoactive material and a solvent on the first electrode; drying the photoactive layer in a closed drying system having a constant volume; and forming a second electrode on the photoactive layer.

The inventors of the present disclosure have introduced a closed drying system having a constant volume in order to adjust morphology of a photoactive layer of an organic solar cell, and have developed a method for manufacturing an organic solar cell capable of increasing light absorption efficiency by adjusting a gas environment in the drying system, a gas composition and a volume in the drying system.

In the closed drying system of present specification, the 'system' means space accommodating a laminate in which a photoactive layer, an object to dry, is formed, and the form is not limited as long as it is capable of having a constant volume.

According to one embodiment of the present specification, the drying the photoactive layer may be carried out in a closed system. The 'closed system' means a system with no air circulation between outside the system and inside the system.

When light is provided to the photoactive layer in the organic solar cell, excitons are produced, and these excitons migrate to the junction of an electron donor and an electron acceptor through diffusion. These excitons migrating to the interface of the electron donor and the electron acceptor are each separated into electrons and holes, and power is generated as the charge is transferred to the electrode.

According to one embodiment of the present specification, the electron donor and the electron acceptor of the photoactive layer forms a bulk heterojunction (BHJ).

In a bulk heterojunction device, when the electron donor and the electron acceptor are completely randomly mixed, separation of excitons to charges is very effective, however, there is a problem in that these separated charges may recombine when migrating to each electrode. In other words, in order to minimize the possibility of separated charge recombination while eliminating a bottleneck phenomenon of excitons, each transfer of electrons and holes needs to be smooth by proper phase separation while increasing a surface area on which the electron donor and the electron acceptor interact in the bulk heterojunction structure.

The proper phase separation may be adjusted through controlling morphology of the photoactive layer.

In order to control morphology of the photoactive layer, a heat treatment process has been performed after drying in the art. However, since the heat treatment is carried out at a high temperature in this case, there has been a problem of damaging a substrate itself or damaging a photoactive layer, and there has been a problem of increasing costs by conducting an additional process.

According to a method of drying the photoactive layer according to one embodiment of the present specification, there are advantages in that morphology of the photoactive layer may be controlled with just a drying process without additional processes, and damage to the photoactive layer is small.

In addition, according to an existing drying method of a photoactive layer by a drying system in which air circulation is present between outside and inside the drying system, air outside the drying system inflows into the drying system while the photoactive layer is dried. Herein, the electron donor and the electron acceptor forming the photoactive layer are not favorably mixed since a composition of a thin film forming the photoactive layer and a composition of the air newly introduced are completely different, which leads to a problem of two polymers being excessively phase separated.

In addition, in an existing drying process using hot air, there has been a problem of a photoactive layer being not uniformly dried since the photoactive layer is dried from the surface due to an air volume of gas during gas injection.

According to one embodiment of the present specification, morphology and interface of the photoactive layer may be effectively controlled by the drying the photoactive layer being conducted in a closed system having a constant volume.

The closed drying system means a state with no air circulation between inside and outside the drying system, and when performing a drying process of the photoactive layer in the closed drying system, the evaporated solvent remains inside the drying system without moving out of the drying system. In other words, an air composition inside the drying system and a composition of the photoactive layer have a similar form as the solvent evaporated while drying the photoactive layer remains inside the drying system. Accordingly, the air inside the drying system and the photoactive layer are favorably mixed, and as a result, the electron donor and the electron acceptor forming the photoactive layer are favorably mixed preventing a problem of phase separation excessively occurring.

In addition, using an existing drying method of a photoactive layer by a drying system in which air circulation is present between outside and inside the drying system, the solution does not remain on the photoactive layer surface during drying, and evaporates to the drying system by the circulating air. In this case, the solution on the photoactive layer quickly evaporates whereas the solution inside the photoactive layer surface slowly evaporates resulting a difference in the drying rate between inside and outside the photoactive layer, and phase separation between the electron donor and the electron acceptor of the photoactive layer does not properly occur.

According to one embodiment of the present specification, the photoactive layer is dried in a drying system in which air circulation is not present between inside and outside the drying system. This prevents the solution on the photoactive layer surface from quickly evaporating, which decreases a difference in the drying rate between inside and outside the photoactive layer, and phase separation between the electron donor and the electron acceptor of the photoactive layer properly occurs.

According to one embodiment of the present specification, the drying the photoactive layer may be carried out in a drying system having a constant volume. The constant volume means having no changes in the volume inside the drying system caused by solvent evaporation while the drying is progressed.

According to one embodiment of the present specification, phase separation between the electron donor and the electron acceptor may be properly controlled by adjusting a ratio of a volume of the solution coated for forming the photoactive layer and the volume of the drying system.

According to one embodiment of the present specification, a ratio of a volume of the solution coated on the first electrode to the volume of the drying system may be from 1:1,000 to 1:5,000, preferably from 1:2,000 to 1:4,000, and more preferably from 1:2,500 to 1:3,600. When the drying system ratio is larger than 1:5,000, the ratio of the volume of the coated solution to the volume of the drying system, the volume of the drying system is excessively large, and the evaporated solvent is not much included in the air inside the drying system, and a problem of excessive phase separation may occur since compositions of the air inside the drying system and the coated solution become different. On the other hand, when the drying system ratio is smaller than 1:1,000, the ratio of the volume of the coated solution to the volume of the drying system, there are problems in that phase separation may not favorably occur, and drying may not be efficient compared to the drying time.

According to one embodiment of the present specification, the volume of the solution coated on the first electrode may be greater than or equal to 50 μl and less than or equal to 300 μl. A preferred volume of the solution may be greater than or equal to 100 μl and less than or equal to 250 μl, and more preferably greater than or equal to 150 μl and less than or equal to 200 μl.

According to one embodiment of the present specification, the volume of the solution coated on the first electrode may be, based on an area of the substrate, greater than or equal to 0.1 μl/cm$^2$ and less than or equal to 10 μl/cm$^2$, preferably greater than or equal to 0.2 μl/cm$^2$ and less than or equal to 8 μl/cm$^2$, and more preferably greater than or equal to 0.4 μl/cm$^2$ and less than or equal to 3 μl/cm$^2$. When the volume of the solution coated on the first electrode is less than 0.4 l/cm$^2$ based on an area of the substrate, the solution may not be uniformly coated, and when the volume of the solution coated on the first electrode is greater than 3 μl/cm$^2$ based on an area of the substrate, there are problems in that phase separation may not favorably occur, and drying may not be efficient compared to the drying time. In other words, the volume satisfying the above-mentioned numerical range is effective in properly inducing phase separation between the electron donor and the electron acceptor of the photoactive layer, and efficiently performing the drying process.

According to one embodiment of the present specification, the volume of the drying system is not particularly limited as long as it is for satisfying the ratio of the volume of the solution coated on the first electrode and the volume of the drying system, and may vary depending on the size of an object to dry or the environments, but may be, for example, greater than or equal to 200 cm$^3$ and less than or equal to 1,000 cm$^3$.

According to one embodiment of the present disclosure, the drying the photoactive layer may be performed at a temperature in a range of from higher than or equal to 30° C. and lower than or equal to 150° C., preferably higher than or equal to 30° C. and lower than or equal to 90° C., and more preferably higher than or equal to 30° C. and lower than or equal to 60° C. When the operating temperature is lower than 30° C., phase separation between the electron donor and the electron acceptor may not favorably occur, and when the operating temperature is higher than 150° C., the photoactive layer or the substrate may be damaged.

According to one embodiment of the present specification, the drying the photoactive layer may be performed for from 5 minutes to 30 minutes. When the operating time is shorter than 5 minutes, phase separation between the electron donor and the electron acceptor may not favorably occur, and the operating time being longer than 30 minutes may result in too much phase separation or damages to the photoactive layer.

According to one embodiment of the present specification, the drying system may comprise an inert gas. When the drying system comprises an inert gas, the photoactive material being oxidized or degraded from moisture and oxygen may be prevented.

According to one embodiment of the present specification, the inert gas included in the drying system may be argon (Ar), nitrogen ($N_2$) or the like.

According to one embodiment of the present specification, a concentration of the inert gas in the drying system may be greater than or equal to 99% by mass and less than or equal to 100% by mass based on the total weight of the whole gas included in the drying system.

According to one embodiment of the present specification, the drying system has a relative humidity at 60° C. of 30% or less. When the relative humidity at 60° C. is greater than 30%, there are disadvantages in that the solvent does not evaporate well, and organic materials forming the photoactive layer may be degraded due to moisture.

According to one embodiment of the present specification, the drying in the drying system is conducted using a method of evaporating a solvent, and the method is not limited as long as it is a method in which gas inside the drying system and gas outside the drying system do not circulate to each other. For example, a method of evaporating a solvent by heating the photoactive layer on the substrate using an oven, or an optical method through infrared rays may be included.

According to one embodiment of the present specification, coating the solution is performed using any one selected from the group consisting of dip coating, screen printing, spray coating, slot die, bar coater, doctor blade, brush painting and deposition. The methods of slot die, bar coater and doctor blade are preferred as the coating method since large area organic solar cells may be manufactured reproducibly.

According to one embodiment of the present specification, the photoactive material is included in an amount of greater than or equal to 0.5% by weight and less than or equal to 10% by weight of the solution.

According to one embodiment of the present specification, the solvent may be one selected from the group consisting of chloroform, chlorobenzene, orthodichlorobenzene, xylene, toluene, cyclohexane and 2-methylanisole, or a mixed solvent of two or more thereof.

According to one embodiment of the present specification, the solution may further comprise one, two or more additives selected from the group consisting of 1,8-diiodooctane (DIO), octanedithiol, diphenyl ether, trichlorobenzene and 1-chloronaphthalene.

In one embodiment of the present specification, the photoactive layer further comprises an additive.

In one embodiment of the present specification, the additive may have a molecular weight of greater than or equal to 50 g/mol and less than or equal to 1,000 g/mol.

The additive may be an organic material having a boiling point of 30° C. to 300° C. The organic material means a material comprising at least one carbon atom.

In order to smoothly separate excitons and effectively transfer separated charges in an organic solar cell, it is required to induce morphology enhancement by securing a continuous path of an electron donor and an electron acceptor through proper phase separation while maximally increasing an interface between the electron donor and the electron acceptor.

According to one embodiment of the present specification, by introducing the additive to the active layer, effective phase separation induced by selective solubility of the polymer and the fullerene derivative for the additive, and the difference in the boiling points between the solvent and the additive may be induced. In addition, morphology may be fixed by crosslinking the electron acceptor material or the electron donor material to prevent phase separation, and morphology may also be controlled through changes in the molecular structure of the electron donor material.

In one embodiment of the present specification, the substrate may be a transparent substrate, and although the transparent substrate is not particularly limited, those having light transmittance of 50% or greater and preferably 75% or greater are preferred. Specifically, glass, a plastic substrate or a plastic film may be used as the transparent substrate. As the plastic substrate or film, materials known in the art may be used, and for example, those formed with one or more types of resins selected from among polyacryl-based, polyurethane-based, polyester-based, polyepoxy-based, polyolefin-based, polycarbonate-based and cellulose-based may be used. More specifically, films having visible light transmittance of 80% or greater such as polyethylene terephthalate (PET), polyvinyl butyral (PVB), polyethylene naphthalate (PEN), polyethersulfone (PES), polycarbonate (PC) and acetyl celluloid are preferred.

In one embodiment of the present specification, when the organic solar cell receives photons from an external light source, electrons and holes are produced between an electron donor and an electron acceptor. The generated holes are transferred to a positive electrode through an electron donor layer.

In one embodiment of the present specification, the organic solar cell further comprises a hole transfer layer, a hole injection layer or a layer carrying out hole transfer and hole injection at the same time.

In another embodiment, the organic solar cell further comprises an electron injection layer, an electron transfer layer or a layer carrying out electron injection and electron transfer at the same time.

Figure 1:
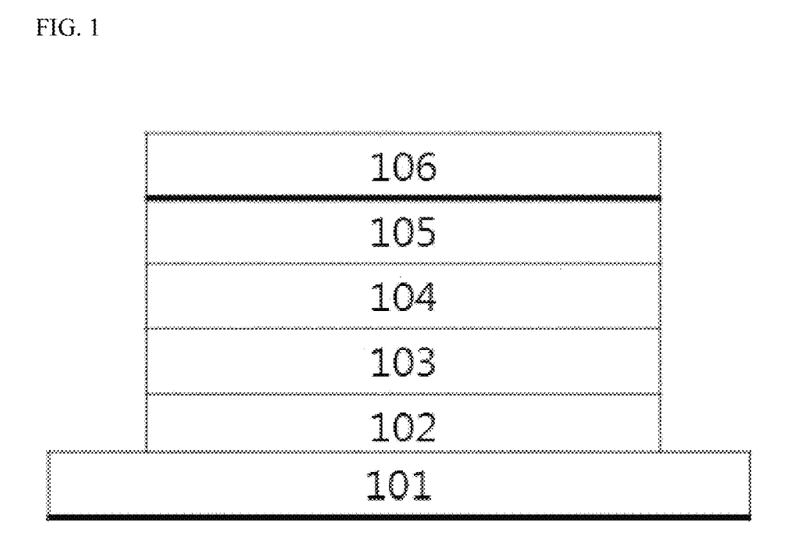
FIG. 1 is a picture of an organic solar cell device according to one embodiment of the present disclosure.

FIG. 1 is a diagram illustrating an organic solar cell according to one embodiment of the present specification.

In one embodiment of the present specification, when the organic solar cell receives photons from an external light source, electrons and holes are produced between an electron donor and an electron acceptor. The generated holes are transferred to a positive electrode through an electron donor layer.

In one embodiment of the present specification, the first electrode is an anode, and the second electrode is a cathode.

In another embodiment, the first electrode is a cathode, and the second electrode is an anode.

In one embodiment of the present specification, the organic solar cell may be arranged in the order of a cathode, a photoactive layer and an anode, or arranged in the order of an anode, a photoactive layer and a cathode, however, the arrangement is not limited thereto.

In another embodiment, the organic solar cell may be arranged in the order of an anode, a hole transfer layer, a photoactive layer, an electron transfer layer and a cathode, or arranged in the order of a cathode, an electron transfer layer, a photoactive layer, a hole transfer layer and an anode, however, the arrangement is not limited thereto.

In one embodiment of the present specification, the organic solar cell has a normal structure. The normal structure may mean forming an anode on a substrate. Specifically, according to one embodiment of the present specification, the first electrode formed on the substrate may be an anode when the organic solar cell has a normal structure.

In one embodiment of the present specification, the organic solar cell has an inverted structure. The inverted structure may mean forming a cathode on a substrate. Specifically, according to one embodiment of the present specification, the first electrode formed on the substrate may be a cathode when the organic solar cell has an inverted structure.

In one embodiment of the present specification, the organic solar cell has a tandem structure. In this case, the organic solar cell may comprise the photoactive layer in two or more layers. The organic solar cell according to one embodiment of the present specification may have the photoactive layer in one, or two or more layers.

In another embodiment, a buffer layer may be provided between a photoactive layer and a hole transfer layer, or between a photoactive layer and an electron transfer layer. Herein, a hole injection layer may be further provided between an anode and the hole transfer layer. In addition, an electron injection layer may be further provided between a cathode and the electron transfer layer.

In one embodiment of the present specification, the photoactive layer comprises one, two or more materials selected from the group consisting of electron donors and acceptors.

In one embodiment of the present specification, the electron donor material may be various polymer materials and monomer materials such as a thiophene-based, a fluorene-based or a carbazole-based.

In one embodiment of the present specification, the electron acceptor material may be selected from the group consisting of fullerene, fullerene derivatives, non-fullerene derivatives, bathocuproine, semiconducting elements, semiconducting compounds and combinations thereof.

Specifically, one, two or more compounds selected from the group consisting of fullerene, fullerene derivatives ((6,6)-phenyl-C61-butyric acid methyl ester (PCBM), (6,6)-phenyl-C61-butyric acid-cholesteryl ester (PCBC), perylene, polybenzimidazole (PBI), 3,4,9,10-perylene-tetracarboxylic bis-benzimidazole (PTCBI), ITIC and ITIC-Th may be included.

In one embodiment of the present specification, the electron donor and an electron form a bulk heterojunction (BHJ).

A bulk heterojunction means an electron donor material and an electron acceptor material being mixed together in a photoactive layer.

In one embodiment of the present specification, the photoactive layer may have a bilayer structure comprising an n-type organic material layer and a p-type organic material layer.

The substrate in the present specification may comprise a glass substrate or a transparent plastic substrate having excellent transparency, surface smoothness, handling easiness and water resistance, but is not limited thereto, and substrates commonly used in organic solar cells may be used without limit. Specific examples thereof comprise glass, polyethylene terphthalate (PET), polyethylene naphthalate (PEN), polypropylene (PP), polyimide (PI), triacetyl cellulose (TAC) and the like, but are not limited thereto.

The anode electrode may comprise a material that is transparent and has excellent conductivity, however, the material is not limited thereto. Examples thereof may comprise metals such as vanadium, chromium, copper, zinc or gold, or alloys thereof, metal oxides such as zinc oxide, indium oxide, indium tin oxide (ITO) or indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

A method of forming the anode electrode is not particularly limited, however, the anode electrode may be formed by being coated on one surface of a substrate or being coated in a film form using a method of, for example, sputtering, E-beam, thermal deposition, spin coating, screen printing, inkjet printing, doctor blade or gravure printing.

When forming the anode electrode on a substrate, the result may go through processes of cleaning, removing moisture and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to remove moisture, and when the substrate is completely cleaned, the surface of the substrate is modified to be hydrophilic.

Through the surface modification such as above, the junctional surface potential may be maintained at a level suitable as surface potential of a photoactive layer. In addition, when a surface is modified, a polymer thin film may be readily formed on an anode electrode, and the quality of the thin film may also be improved.

Preprocessing technologies for the anode electrode comprise a) a surface oxidation method using parallel plate discharge, b) a method of oxidizing the surface through ozone generated using UV rays in a vacuum state, and c) an oxidation method using oxygen radicals generated by plasma.

One of the methods described above may be selected depending on the condition of the anode electrode or the substrate. However, it is commonly preferred to prevent the leave of oxygen on the surface of the first electrode or the substrate and to suppress the remaining of moisture and organic materials as much as possible, no matter which method is used. Practical effects of the preprocessing may be maximized in this case.

As a specific example, a method of oxidizing the surface through ozone generated using UV may be used. Herein, a patterned ITO substrate may be fully dried by baking the patterned ITO substrate on a hot plate after being ultrasonic cleaned, and the patterned ITO substrate is introduced into a chamber and then may be cleaned by the ozone generated by reacting oxygen gas with UV light using a UV lamp.

However, the method of surface modification of the patterned ITO substrate in the present specification is not particularly limited, and any method oxidizing a substrate may be used.

The cathode electrode may comprise a metal having small work function, but is not limited thereto. Specific examples thereof may comprise metals such as magnesium, calcium, sodium, potassium, titanium, indium, yttrium, lithium, gadolinium, aluminum, silver, tin and lead, or alloys thereof; or multilayer-structured materials such as LiF/Al, $LiO_2$/Al, LiF/Fe, Al:$BaF_2$ and Al:$BaF_2$:Ba, but are not limited thereto.

The cathode electrode may be formed by being deposited inside a thermal depositor having a vacuum degree of $5 \times 10^{-7}$ torr or less, however, the formation is not limited to this method.

The hole transfer layer and/or the electron transfer layer play a role of efficiently transferring electrons and holes separated in a photoactive layer to an electrode, and the material is not particularly limited.

The hole transfer layer material may comprise poly(3,4-ethylenedioxythiophene)-poly(styrenesulfonate) (PEDOT:PSS), molybdenum oxide ($MoO_x$); vanadium oxide ($V_2O_5$); nickel oxide (NiO); tungsten oxide ($WO_x$) and the like, but is not limited thereto.

The electron transfer layer material may comprise electron-extracting metal oxides, and may specifically comprise a metal complex of 8-hydroxyquinoline; a complex comprising $Alq_3$; a metal complex comprising Liq; LiF; Ca; titanium oxide ($TiO_x$); zinc oxide (ZnO); cesium carbonate ($Cs_2CO_3$), polyethyleneimine (PEI) and the like, but is not limited thereto.

The present specification provides an organic solar cell manufactured using the method for manufacturing an organic solar cell described above.

The organic solar cell manufactured according to one embodiment of present specification has an energy conversion efficiency of 6% or greater. A method of measuring the energy conversion efficiency will be described below.

The energy conversion efficiency of the organic solar cell is a value obtained by dividing the product of an open circuit voltage ($V_{oc}$), a short-circuit current ($J_{sc}$) and a fill factor (FF) by intensity of light, and may be calculated by Mathematical Formula 1 as follows.

$$\eta = FF * J_{sc} * V_{oc}/(\text{intensity of irradiated light}) \quad [\text{Mathematical Formula 1}]$$

(In the above, FF is a fill factor, $J_{sc}$ is light short-circuit current density, and $V_{oc}$ is a light open circuit voltage.)

Hereinafter, the present specification will be described in detail with reference to examples in order to specifically describe the present specification. However, examples according to the present specification may be modified to various different forms, and the scope of the present specification is not construed as being limited to the examples described below. The examples of the present specification are provided in order to more fully describe the present specification to those having average knowledge in the art.

EXPERIMENTAL EXAMPLE

Example 1

<Preparation of Composite Solution>

A composite solution was prepared by dissolving a compound represented by Compound 1 and (6,6)-phenyl-C61-butyric acid methyl ester (PCBM) in chlorobenzene (CB) in a mass ratio of 1:2. Herein, the concentration of the compound and the PCBM with respect to the composite solution was adjusted to 3 wt %.

<Preparation of Substrate>

In order to manufacture an organic solar cell having a structure of ITO/ZnO/photoactive layer/$MoO_3$/Ag, a glass substrate (117 cm$^2$) on which ITO was coated in a strip type was ultrasonic cleaned using distilled water, acetone and 2-propanol, and the ITO surface was ozone treated for 10 minutes.

<Formation of First Electrode>

On the substrate, ZnO was bar-coated to a thickness of 45 nm, and the result was heat treated for 10 minutes at 100° C.

<Formation of Photoactive Layer>

On the first electrode, 170 μl of the composite solution was coated using bar-coating.

<Drying>

The composite solution-coated laminate was introduced into a closed drying system having a volume of 600 cm$^3$, and dried for 15 minutes at 60° C.

<Formation of Second Electrode>

After that, using a thermal evaporator under vacuum of 3×10$^{-8}$ torr, MoO$_3$ was deposited to 10 nm at a rate of 0.5 Å/s, and Ag was deposited to a thickness of 100 nm at a rate of 1 Å/s to manufacture a final organic solar cell.

[Compound 1]

R1 and R2 of Compound 1 are the same as or different from each other, and each independently hydrogen; fluorine; a substituted or unsubstituted alkyl group; a substituted or unsubstituted aryl group; or a substituted or unsubstituted heterocyclic group.

Compound 1 may be the following Compound 1-2.

Properties of the organic solar cells according to Example 1 and Comparative Examples 1 to 3 were measured three times each, and an average value was calculated and summarized in the following Table 1.

TABLE 1

|  | $V_{oc}$ (V) | $J_{sc}$ (mA/cm$^2$) | FF | η (%) |
| --- | --- | --- | --- | --- |
| Example 1 | 3.729 | 2.792 | 0.613 | 6.383 |
| Comparative Example 1 | 3.397 | 1.439 | 0.464 | 2.29 |
| Comparative Example 2 | 2.806 | 0.157 | 0.329 | 0.143 |
| Comparative Example 3 | 3.573 | 1.403 | 0.481 | 2.41 |

In the present specification, $V_{oc}$ means an open circuit voltage, $J_{sc}$ means a short circuit current, FF means a fill factor, and η means energy conversion efficiency.

The open circuit voltage is a voltage generated when light is irradiated without an external electrical load, that is, a voltage when a current is 0, and a short circuit current is defined as a current generated when light is irradiated with a shortened electrical contact, that is, a current by light when no voltage is applied.

In addition, the fill factor is defined by a value obtaining by dividing the product of, when applying a current and a voltage, the current and the voltage changed therefrom by the product of the open circuit voltage and the short circuit current. When such a fill factor is closer to 1, efficiency of a solar cell increases, and as the fill factor decreases, resistance is evaluated to increase.

With reference to [Table 1], device characteristics of the organic solar cells of the present disclosure manufactured above are compared. In the organic solar cell manufactured using a drying method without limiting a volume of a drying

[Compound 1-2]

Comparative Example 1

An organic solar cell was manufactured in the same manner as in Example 1 except that the drying system had a volume of 1300 cm$^3$.

Comparative Example 2

An organic solar cell was manufactured in the same manner as in Example 1 except that the drying system had a volume of 150 cm$^3$.

Comparative Example 3

An organic solar cell was manufactured in the same manner as in Example 1 except that the drying system is not a closed drying system, and the drying was conducted in the atmosphere that is open everywhere.

system (open system), energy conversion efficiency was just 2.41% (Comparative Example 3), however, when drying the photoactive layer in a closed drying system with no air circulation inside and outside the drying system (closed system), it was identified that the organic solar cell efficiency was 6.383%, which increased by approximately 160%.

Figure 3:
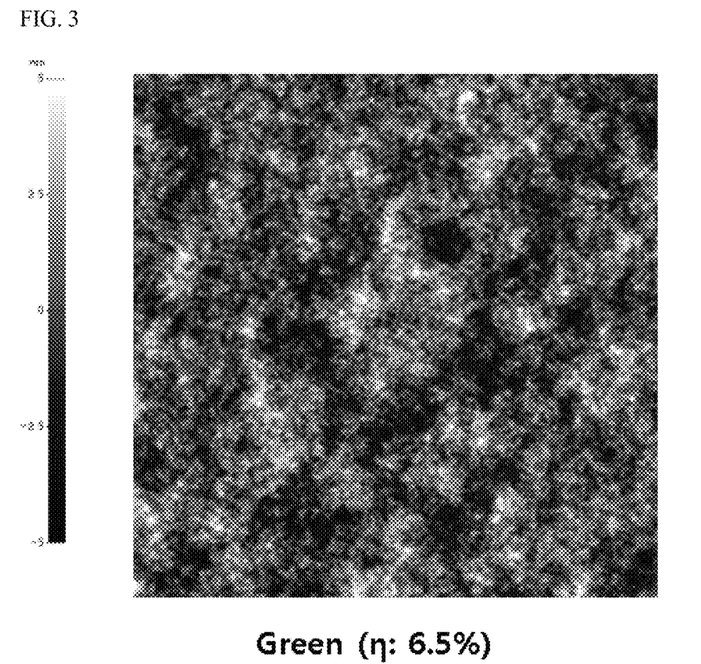
FIG. 3 is an AFM image of a photoactive layer of an organic solar cell according to Example 1.
Figure 4:
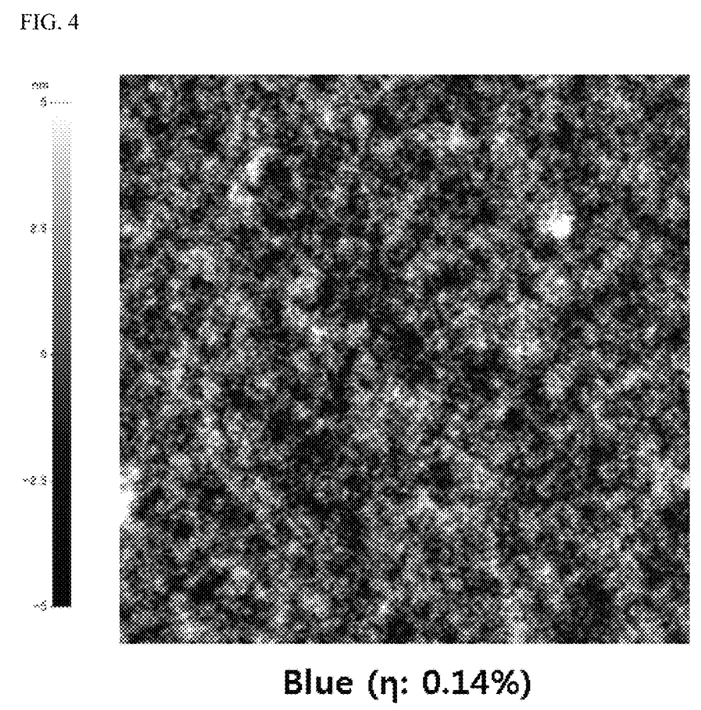
FIG. 4 is an AFM image of a photoactive layer of an organic solar cell according to Comparative Example 2.
Figure 5:
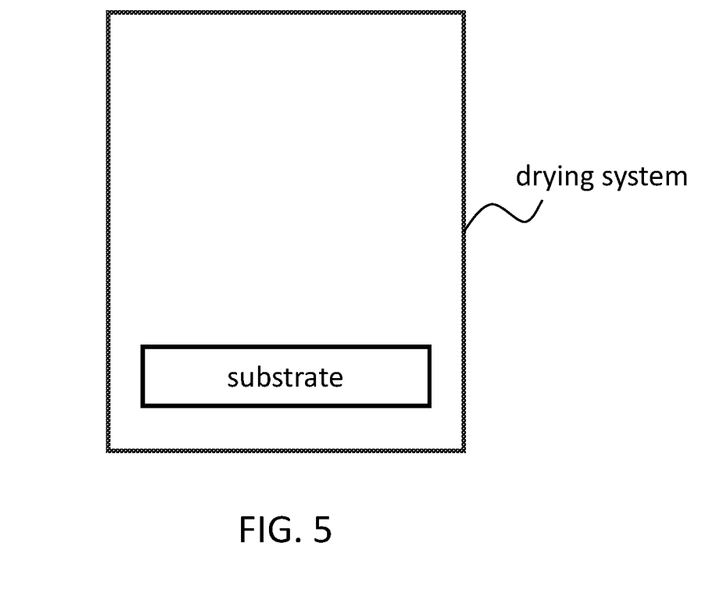
FIG. 5 is a schematic diagram of a drying system.

When comparing Example 1 and Comparative Example 2 to each other, phase separation between the electron donor and the electron acceptor properly occurred during the drying process when the drying system had a volume of 600 cm$^3$ compared to 150 cm$^3$, and it was seen that the organic solar cell had excellent efficiency. This was seen by comparing FIG. 3 (AFM image of the photoactive layer of the organic solar cell according to Example 1) and FIG. 4 (AFM image of the photoactive layer of the organic solar cell according to Comparative Example 2). It was identified that phase separation between the electron donor and the electron acceptor favorably occurred in FIG. 3 compared to FIG. 4.

Figure 2:
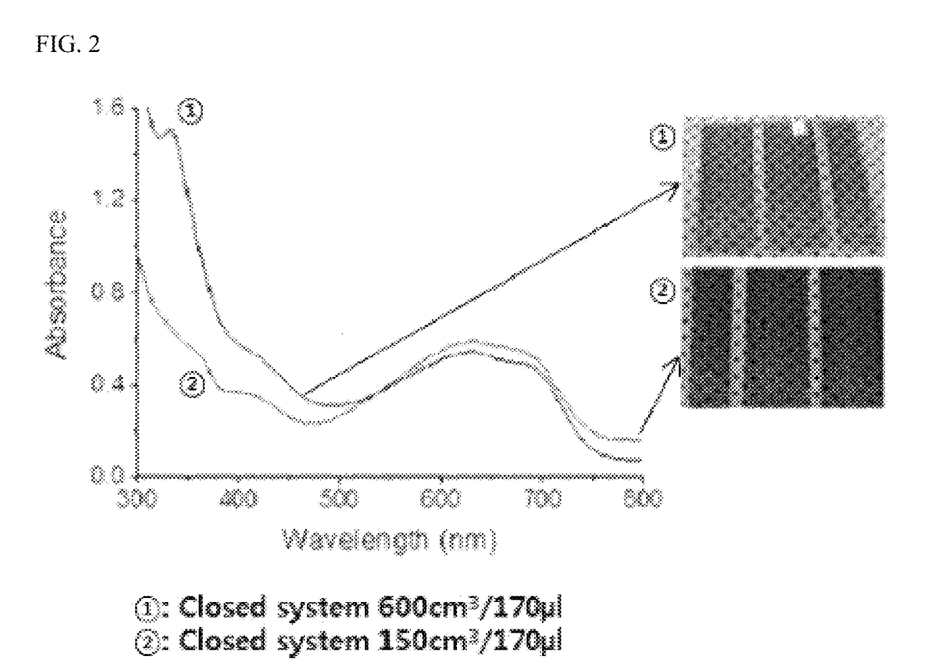
FIG. 2 is a graph presenting a light absorption rate of organic solar cells according to Example 1 and Comparative Example 2.

With reference to FIG. 2, changes in the characteristics of the organic solar cells depending on the volume of the drying system were examined. The graph presented in FIG. 2 is a graph showing changes in the light absorption rate by a wavelength region depending on the changes in the volume of the drying system used for drying the photoactive layer. When referring to the graph and the drawing, it was seen that the light absorption rate was the highest when a volume ratio of the drying system with respect to the solution used for forming the photoactive layer was approximately 1:3500, and it was seen that the light absorption rate decreased when the volume ratio was less than 1:1,000.

Through such experimental results, it was identified that, when drying the photoactive layer, an organic solar cell having excellent energy conversion efficiency was prepared when drying in a closed drying system having a constant volume (Example 1) compared to drying in an open drying system that does not have a constant volume (Comparative Example 3).

In addition, it was identified that the manufactured organic solar cell had excellent energy conversion efficiency when the volume of the drying system was adjusted to a certain range, whereas energy conversion efficiency of the manufactured organic solar cell decreased when the volume of the drying system was too small (Comparative Example 2), or too large (Comparative Example 1).

REFERENCE NUMERAL

101: Substrate
102: First Electrode
103: Electron Transfer Layer
104: Photoactive Layer
105: Hole Transfer Layer
106: Second Electrode

What is claimed is:

1. A method for manufacturing an organic solar cell, the method comprising:
   providing a substrate;
   forming a first electrode on the substrate;
   forming a photoactive layer by coating a solution including a photoactive material and a solvent on the first electrode, wherein the photoactive layer comprises at least one organic electron donor compound and at least one organic electron acceptor compound;
   drying the photoactive layer in a closed drying system having a constant volume, wherein a ratio of a volume of the solution coated on the first electrode to the volume of the closed drying system is from 1:1,000 to 1:5,000; and
   forming a second electrode on the photoactive layer,
   wherein a volume of the solution coated on the first electrode is greater than or equal to 0.1 $\mu l/cm^2$ and less than or equal to 10 $\mu l/cm^2$ based on an area of the substrate.

2. The method for manufacturing the organic solar cell of claim 1, wherein drying the photoactive layer is performed at a temperature in a range of from 30° C. and to 150° C.

3. The method for manufacturing the organic solar cell of claim 1, wherein drying the photoactive layer is performed for from 5 minutes to 30 minutes.

4. The method for manufacturing the organic solar cell of claim 1, wherein the closed drying system includes an inert gas.

5. The method for manufacturing the organic solar cell of claim 4, wherein the inert gas is argon (Ar) or nitrogen ($N_2$).

6. The method for manufacturing the organic solar cell of claim 1, wherein the closed drying system has a relative humidity at 60° C. of 30% or less.

7. The method for manufacturing the organic solar cell of claim 1, wherein coating the solution is performed using any one method selected from the group consisting of dip coating, screen printing, spray coating, slot die, bar coater, doctor blade and brush painting.

8. The method for manufacturing the organic solar cell of claim 1, wherein the photoactive material is included in an amount of greater than or equal to 0.5% by weight and less than or equal to 10% by weight of the solution.

9. The method for manufacturing the organic solar cell of claim 1, wherein the solvent is one selected from the group consisting of chloroform, chlorobenzene, orthodichlorobenzene, xylene, toluene, cyclohexane and 2-methylanisole, or any combination thereof.

10. The method for manufacturing the organic solar cell of claim 1, wherein the solution includes one, two or more additives selected from the group consisting of 1,8-diiodooctane (DIO), octanedithiol, diphenyl ether, trichlorobenzene and 1-chloronaphthalene.

11. An organic solar cell manufactured using the method for manufacturing the organic solar cell of claim 1.

12. The organic solar cell of claim 11, wherein the organic solar cell has an energy conversion efficiency of 6% or greater.

13. The method for manufacturing the organic solar cell of claim 1, wherein air outside of the closed drying system is not supplied into the closed drying system while drying the photoactive layer.

14. The method for manufacturing the organic solar cell of claim 13, wherein gas inside of the closed drying system does not exhaust to the outside of the closed drying system while drying the photoactive layer.

15. A method for manufacturing an organic solar cell, the method comprising:
   providing a substrate;
   forming a first electrode on the substrate;
   forming a photoactive layer by coating a solution including a photoactive material and a solvent on the first electrode, wherein the photoactive layer comprises at least one organic electron donor compound and at least one organic electron acceptor compound;
   drying the photoactive layer in a drying space having a constant volume, wherein, while drying the photoactive layer, air outside of the drying space is not supplied into the drying space and gas inside of the drying space does not exhaust to the outside of the drying space; and
   forming a second electrode on the photoactive layer,
   wherein a volume of the solution coated on the first electrode is greater than or equal to 0.1 $\mu l/cm^2$ and less than or equal to 10 $\mu l/cm^2$ based on an area of the substrate.

16. The method for manufacturing the organic solar cell of claim 15, wherein the photoactive material is included in an amount of greater than or equal to 0.5% by weight and less than or equal to 10% by weight of the solution.

17. The method for manufacturing the organic solar cell of claim 15, wherein drying the photoactive layer is performed at a temperature in a range of from 30° C. and to 150° C.

18. The method for manufacturing the organic solar cell of claim 15, wherein a ratio of a volume of the solution coated on the first electrode to the volume of the drying space is from 1:1,000 to 1:5,000.

\* \* \* \* \*

UNITED STATES PATENT AND TRADEMARK OFFICE
CERTIFICATE OF CORRECTION

PATENT NO. : 11,171,289 B2  
APPLICATION NO. : 16/605910  
DATED : November 9, 2021  
INVENTOR(S) : Choi et al.

Page 1 of 1

It is certified that error appears in the above-identified patent and that said Letters Patent is hereby corrected as shown below:

On the Title Page (73) Assignee: Please correct "LG CHEM, LTD." to read -- LG CHEM, LTD. (KR) --

Signed and Sealed this
Twenty-sixth Day of April, 2022

Katherine Kelly Vidal
*Director of the United States Patent and Trademark Office*